United States Patent
Iihola et al.

(10) Patent No.: US 8,240,032 B2
(45) Date of Patent: Aug. 14, 2012

(54) METHOD FOR MANUFACTURING AN ELECTRONICS MODULE COMPRISING A COMPONENT ELECTRICALLY CONNECTED TO A CONDUCTOR-PATTERN LAYER

(75) Inventors: Antti Iihola, Helsinki (FI); Timo Jokela, Halikko (FI); Petteri Palm, Helsinki (FI); Risto Tuominen, Helsinki (FI)

(73) Assignee: Imbera Electronics Oy, Esppo (FI)

( * ) Notice: Subject to any disclaimer, the term of this patent is extended or adjusted under 35 U.S.C. 154(b) by 1006 days.

(21) Appl. No.: 11/570,673

(22) PCT Filed: Jun. 13, 2005

(86) PCT No.: PCT/FI2005/000274
§ 371 (c)(1),
(2), (4) Date: Jun. 30, 2008

(87) PCT Pub. No.: WO2005/125298
PCT Pub. Date: Dec. 29, 2005

(65) Prior Publication Data
US 2008/0261338 A1    Oct. 23, 2008

(30) Foreign Application Priority Data
Jun. 15, 2004    (FI) ................................. 20040827

(51) Int. Cl.
*H01L 24/19* (2006.01)
*H05K 3/30* (2006.01)

(52) U.S. Cl. ............. 29/834; 29/832; 29/852; 438/118; 438/121

(58) Field of Classification Search .............. 29/846, 29/852, 831–836, 837; 174/260–261, 258, 174/259
See application file for complete search history.

(56) References Cited

U.S. PATENT DOCUMENTS
4,246,595 A    1/1981    Noyori et al.
(Continued)

FOREIGN PATENT DOCUMENTS
EP    0 774 888    5/1997
(Continued)

OTHER PUBLICATIONS
International Preliminary Report on Patentability on International Application No. PCT/FI2005/000274, Dec. 20, 2006, 7 pages.

*Primary Examiner* — Derris Banks
*Assistant Examiner* — Kaying Kue
(74) *Attorney, Agent, or Firm* — Faegre Baker Daniels LLP

(57) ABSTRACT

Method for manufacturing an electronic module, which electronic module includes a component (6), which is connected electrically to a conductor-pattern layer (14). In the method contact openings (17) are made in the conductor layer (4), the mutual positions of which correspond to the mutual positions of the contact areas (7) of the component (6). After this, the component (6) and the conductor layer (4) are aligned relative to each other, in such a way that the contact areas (7) of the component (6) come to the positions of the contact openings (17), and the component (6) is secured. After this, at least in the contact openings (17) and the contact areas (7) of the component (6) a conductor material is made that connects the component (6) to the conductor layer (4). After the making of the contact the conductor layer (4) is patterned to form a conductor-pattern layer (14).

20 Claims, 10 Drawing Sheets

U.S. PATENT DOCUMENTS

| Patent No. | | Date | Inventor | Class |
|---|---|---|---|---|
| 4,731,645 | A | 3/1988 | Parmentier et al. | |
| 4,993,148 | A | 2/1991 | Adachi et al. | |
| 5,042,145 | A | 8/1991 | Boucquet | |
| 5,048,179 | A * | 9/1991 | Shindo et al. | 29/840 |
| 5,081,562 | A | 1/1992 | Adachi et al. | |
| 5,216,806 | A | 6/1993 | Lam | |
| 5,227,338 | A | 7/1993 | Kryzaniwsky | |
| 5,248,852 | A | 9/1993 | Kumagai | |
| 5,306,670 | A | 4/1994 | Mowatt et al. | |
| 5,353,195 | A | 10/1994 | Fillion et al. | |
| 5,355,102 | A | 10/1994 | Komrumpf et al. | |
| 5,407,864 | A | 4/1995 | Kim | |
| 5,497,033 | A * | 3/1996 | Fillion et al. | 257/723 |
| 5,510,580 | A | 4/1996 | Shirai et al. | |
| 5,552,633 | A | 9/1996 | Sharma | |
| 5,633,204 | A * | 5/1997 | Tago et al. | 438/614 |
| 5,637,919 | A | 6/1997 | Grabbe | |
| 5,654,220 | A | 8/1997 | Leedy | |
| 5,838,545 | A | 11/1998 | Clocher et al. | |
| 5,840,593 | A | 11/1998 | Leedy | |
| 5,870,289 | A * | 2/1999 | Tokuda et al. | 361/779 |
| 5,882,957 | A | 3/1999 | Lin | |
| 5,936,847 | A | 8/1999 | Kazle | |
| 5,985,693 | A | 11/1999 | Leedy | |
| 6,037,665 | A * | 3/2000 | Miyazaki | 257/773 |
| 6,038,133 | A | 3/2000 | Nakatani et al. | |
| 6,084,781 | A * | 7/2000 | Klein | 361/771 |
| 6,154,366 | A | 11/2000 | Ma et al. | |
| 6,232,666 | B1 | 5/2001 | Corisis et al. | |
| 6,242,282 | B1 | 6/2001 | Fillion et al. | |
| 6,271,469 | B1 * | 8/2001 | Ma et al. | 174/521 |
| 6,284,564 | B1 | 9/2001 | Balch et al. | |
| 6,292,366 | B1 | 9/2001 | Platt | |
| 6,396,148 | B1 | 5/2002 | Eichelberger et al. | |
| 6,402,970 | B1 * | 6/2002 | Lin | 216/13 |
| 6,475,877 | B1 * | 11/2002 | Saia et al. | 438/460 |
| 6,489,685 | B2 | 12/2002 | Asahi et al. | |
| 6,537,848 | B2 | 3/2003 | Camenforte et al. | |
| 6,538,210 | B2 | 3/2003 | Sugaya et al. | |
| 6,551,861 | B1 | 4/2003 | Lin | |
| 6,562,660 | B1 | 5/2003 | Sakamoto et al. | |
| 6,576,493 | B1 | 6/2003 | Lin | |
| 6,607,943 | B1 | 8/2003 | Kinsman | |
| 6,710,458 | B2 | 3/2004 | Seko | |
| 6,710,614 | B1 | 3/2004 | Ding et al. | |
| 6,713,859 | B1 | 3/2004 | Ma | |
| 6,783,077 | B1 | 8/2004 | Fannasch | |
| 6,790,712 | B2 | 9/2004 | Bai | |
| 6,806,428 | B1 * | 10/2004 | Kimura et al. | 174/260 |
| 6,876,072 | B1 | 4/2005 | Wang et al. | |
| 6,979,596 | B2 | 12/2005 | Corisis et al. | |
| 6,991,966 | B2 | 1/2006 | Tuominen | |
| 7,183,658 | B2 * | 2/2007 | Towle et al. | 257/784 |
| 7,294,529 | B2 | 11/2007 | Tuominen | |
| 7,663,215 | B2 | 2/2010 | Tuominen et al. | |
| 7,673,387 | B2 * | 3/2010 | Tuominen et al. | 29/852 |
| 7,696,005 | B2 * | 4/2010 | Iihola et al. | 438/107 |
| 2002/0017711 | A1 | 2/2002 | Kwon et al. | |
| 2002/0053465 | A1 | 5/2002 | Kawakita et al. | |
| 2002/0117743 | A1 | 8/2002 | Nakatani et al. | |
| 2002/0133943 | A1 | 9/2002 | Sakamoto et al. | |
| 2002/0185303 | A1 | 12/2002 | Takeuchi et al. | |
| 2003/0067074 | A1 | 4/2003 | Kinsman | |
| 2003/0068852 | A1 * | 4/2003 | Towle et al. | 438/200 |
| 2003/0068877 | A1 | 4/2003 | Kinsman | |
| 2003/0100142 | A1 | 5/2003 | Shin et al. | |
| 2003/0137045 | A1 | 7/2003 | Sugaya et al. | |
| 2003/0159852 | A1 * | 8/2003 | Nakamura | 174/255 |
| 2003/0209796 | A1 | 11/2003 | Kindo et al. | |
| 2004/0000710 | A1 | 1/2004 | Oya | |
| 2004/0097086 | A1 | 5/2004 | Igarashi | |
| 2004/0266067 | A1 | 12/2004 | Bai | |
| 2005/0000729 | A1 | 1/2005 | Iljima et al. | |
| 2005/0001331 | A1 | 1/2005 | Kojima et al. | |
| 2005/0285244 | A1 | 12/2005 | Chen | |
| 2006/0105500 | A1 | 5/2006 | Chang | |
| 2006/0124345 | A1 | 6/2006 | Asami et al. | |
| 2006/0163740 | A1 * | 7/2006 | Ohno et al. | 257/762 |
| 2006/0278967 | A1 | 12/2006 | Tuominen et al. | |
| 2007/0166886 | A1 | 7/2007 | Iihola et al. | |
| 2007/0267136 | A1 | 11/2007 | Tuominen et al. | |
| 2008/0202801 | A1 * | 8/2008 | Tuominen et al. | 174/260 |
| 2008/0295326 | A1 * | 12/2008 | Tuominen et al. | 29/832 |
| 2010/0202115 | A1 * | 8/2010 | Tuominen et al. | 361/746 |

FOREIGN PATENT DOCUMENTS

| | | |
|---|---|---|
| EP | 0774888 A2 | 5/1997 |
| EP | 1 111 662 | 6/2001 |
| EP | 1111662 A2 | 6/2001 |
| EP | 1156525 | 11/2001 |
| GB | 342995 | 5/2000 |
| JP | 04283987 | 10/1992 |
| JP | 913567 | 5/1997 |
| JP | 2757748 | 5/1998 |
| JP | 11103165 | 4/1999 |
| JP | 2000311229 | 11/2000 |
| JP | 2000349437 | 12/2000 |
| JP | 2001053447 | 2/2001 |
| JP | 2001274034 | 10/2001 |
| JP | 2001345560 | 12/2001 |
| JP | 2002016327 | 1/2002 |
| JP | 2002158307 | 5/2002 |
| JP | 2002271033 | 9/2002 |
| JP | 200337205 | 2/2003 |
| JP | 2003188314 | 7/2003 |
| JP | 2004146634 | 5/2004 |
| WO | 03/065778 A1 | 8/2003 |
| WO | 03/065779 A1 | 8/2003 |
| WO | WO2004077902 | 9/2004 |
| WO | WO2004077903 | 9/2004 |
| WO | 2004/089048 A1 | 10/2004 |
| WO | 2005/027602 A1 | 3/2005 |
| WO | WO2005020651 | 3/2005 |

\* cited by examiner

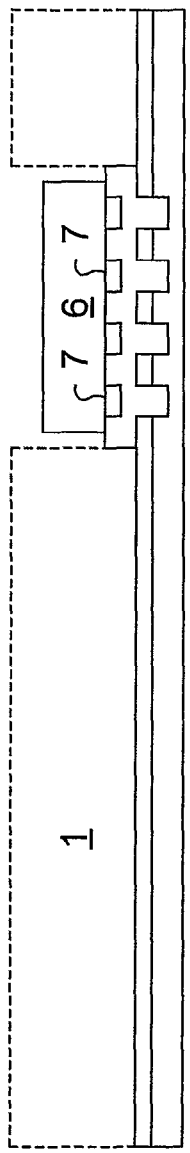
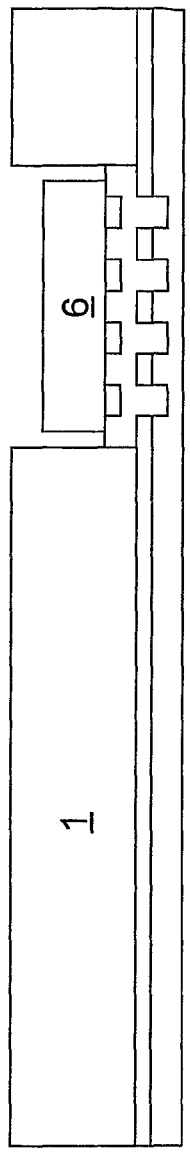
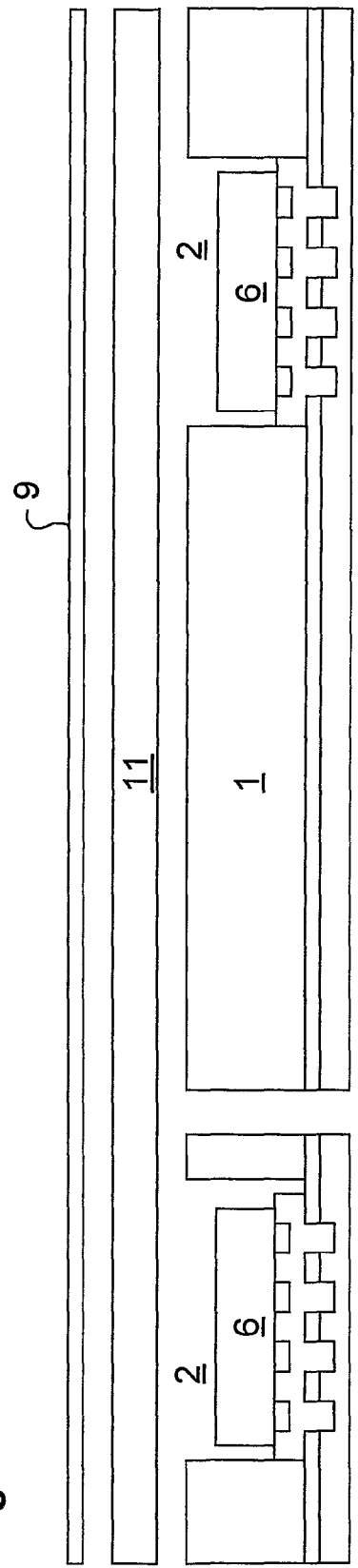
Fig. 4
Fig. 5
Fig. 6

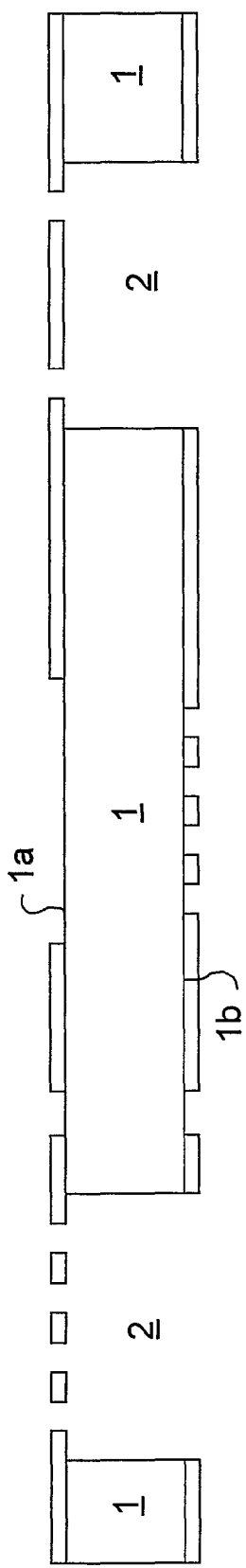
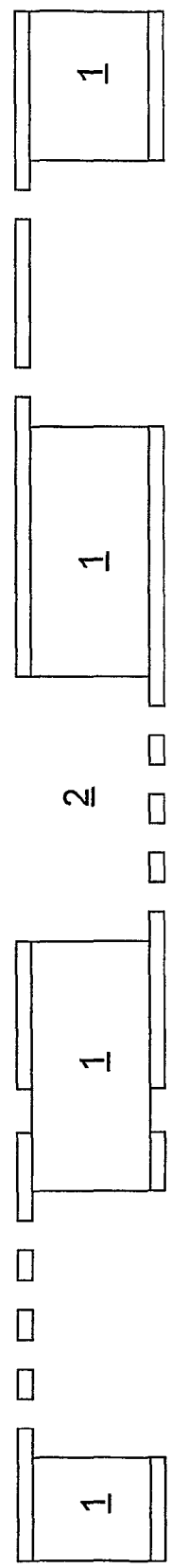
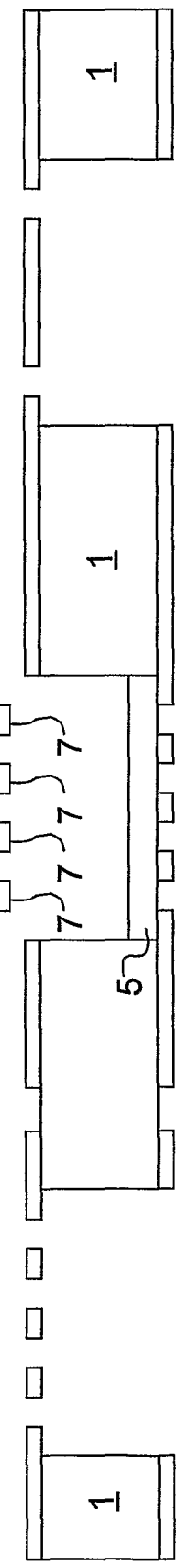
Fig. 15
Fig. 16
Fig 17

METHOD FOR MANUFACTURING AN ELECTRONICS MODULE COMPRISING A COMPONENT ELECTRICALLY CONNECTED TO A CONDUCTOR-PATTERN LAYER

The present invention relates to a method for manufacturing an electronic module.

The invention particularly relates to a manufacturing method, in which one or more components are embedded in an installation base. The electronic module being manufactured can be a module like a circuit board, which contains several components, which are connected to each other electrically through conductor structures manufactured in the electronic module. In particular, the invention relates to an electronic module, which contains microcircuits, to which several contact terminals are connected. Of course, in addition to, or instead of microcircuits, other components too, for example passive components, can be embedded in an installation base. The intention is thus to embed in the electronic module components that are typically attached uncased to a circuit board (to the surface of the circuit board). Another important component group consists of components that are typically encased for attachment to a circuit board. The electronic modules, to which the invention relates, can of course also include other kinds of components.

The installation base can be of a type that is generally used in the electronics industry as a base for installing electrical components. The tasks of the base are to provide a mechanical attachment base for the components as well as the necessary electrical connections, both to the other components on the base and to those outside the base. The installation base can be a circuit board, so that the structure and method to which the invention relates are closely associated with circuit-board manufacturing technology. The installation base can also be some other base, for example, a base used for packaging a component or components, or the base of a complete operational module.

Circuit-board manufacturing technology differs from the manufacture of microcircuits, for instance, in that, in the manufacturing techniques of microcircuits, the installation base, that is a substrate, is a semiconductor material, whereas the basic material of the installation base of circuit boards is some kind of insulation material. The techniques for manufacturing microcircuits are also typically considerably more expensive that those for manufacturing circuit boards.

The casings and packages of components and particularly semiconductor components differ from the construction and manufacture of circuit boards, in that the primary purpose of component packages is to form a casing around the component, which will protect the component mechanically and facilitate the handling of the component. On the surface of the component casing, there are connection parts, typically protrusions, with the aid of which the cased component can be easily correctly aligned on the circuit board and the desired connections created to it. In addition, there are conductors inside the component case, which connect the connection parts protruding outside the case to the connection areas on the surface of the actual component, through which the component can be connected as desired to its surroundings.

However, the cases of components manufactured using this traditional technology demand a considerable amount of space. As the size of electronic devices has diminished, attempts have been made to get rid of component cases, which not only demand much space, but are also unnecessary and lead to needless costs. To solve this problem, various constructions and methods have been developed, with the aid of which components can be located inside the circuit-board structure. It would be preferable for components to be placed inside the circuit board during the creation of the circuit board.

U.S. Pat. No. 6,489,685 discloses one solution, in which components are placed inside a circuit board during the creation of the circuit board. In the solution, conductor patterns are made on top of a support base and the component is connection to the manufactured conductor patterns. After this, an insulating layer acting as the base material of the circuit board, on the surface of which there can be additional conductor patterns, is formed on top of the conductor patterns and the component. After the creation of the insulating layer, the support base is detached from the structure.

U.S. Pat. No. 6,038,133 discloses not only a method similar to the one described above, but also a second solution, in which the components are placed inside the circuit board during the creating of the circuit board. In the second solution, the components are glued to copper foil with a conductive adhesive, after which an insulating layer acting as the base material of the circuit board is formed on top of the copper foil and the component. After the creation of the insulating layer, conductor patterns are made from the copper foil.

International patent application publication WO 03/065778 discloses a method, in which at least one conductor pattern is made in the base, as well as vias for semiconductor components. After this, semiconductor components, aligned relative to the conductor pattern, as placed in the vias. The semiconductor components are attached to the base structure and one or more conductor-pattern layers are made in the base, in such a way that at least one conductor pattern forms an electrical contact with contact areas on the surface of the semiconductor component.

International patent application publication WO 03/065779 discloses a method, in which vias are made in a base for semiconductor components, in such a way that the vias extend between the first and the second surfaces. After the manufacture of the vias, a polymer membrane is spread over the second surface of the base structure, in such a way that the polymer membrane also covers the vias made for semiconductor components, from the side of the second surface of the base structure. Before the polymer membrane hardens, or partly hardens the semiconductor components are placed in holes made in the base, from the direction of the first surface of the base. The semiconductor components are pressed against the polymer membrane, so that they adhere to the polymer membrane. After this, the final curing of the polymer membrane takes place and additional conductor layers are made, in such a way that at least one conductor layer forms an electrical contact with the contact areas on the surface of the semiconductor components.

In the methods disclosed in patent application publications WO 03/065778 and WO 03/065779, the contacts to the contact bumps or other contact areas of the component are made using the via method. The via method can be used to make a very high quality and reliable electrical contact to a component. This is based on the fact that, in making the contact it is possible to use a chemical or electrochemical metallization method. The contact areas can also be cleaned prior to metallization, for example with the aid of a laser or plasma. On the other hand, in the methods disclosed in the WO publications the components cannot be contacted to the conductor-pattern layer that is directly on the surface of the insulating layer that is the base material of the circuit board.

In turn, the methods disclosed in publications U.S. Pat. No. 6,489,685 and U.S. Pat. No. 6,038,133, have the advantage that the component can be attached directly to the conductor layer that is on the surface of the insulating layer acting as the base material of the circuit board. This is an extremely advantageous property when aiming for the cost-effective manufacture of small electronic modules. In the methods of the US publications, it is also possible to position the component directly in the conductor pattern, in which case it can be assumed that fewer problems relating to alignment accuracy will arise. When manufacturing electronic modules for demanding applications, the methods disclosed in the US publications can, however, lead to reliability and yield problems, due to the manner of making electrical contacts with a component.

When aiming to manufacture small and reliable constructions cost-effectively, the alignment of the components and the method of creating contacts to the components are quite significant factors. It should be possible to align the component very accurately and the alignment and it should also preferably be possible to check the alignment before it is finally buried inside the circuit board. Wrongly aligned components will create a reliability problem and will also reduce yield, in which case the profitability of the manufacture of the module will suffer. Correspondingly, the yield and reliability will also be influenced by the method of making contacts to the component.

The invention is intended to create a new method, by means of which components can be placed inside a circuit board or other electronic module. In particular, the method should permit the making of high quality and reliable electrical connections with the contact bumps or other contact areas of the component. In addition, it should be possible to align the component accurately and to connect them electrically directly to the conductor layer that is immediately on the surface of the insulating layer that is the base material of the circuit board.

The invention is based on first manufacturing contact openings in the conductor layer relating to the components, at the positions of the contact areas of the components. After this, the components are attached to the conductor layer, aligned relative to the contact openings, for example with the aid of an insulating adhesive. After this, electrical contacts between the conductor layer and the contact areas of the components are formed through the contact openings. After the electrical contacts are manufactured, conductor patterns are manufactured from the conductor layer.

More specifically, the method according to the invention is characterized by what is stated in the characterizing portion of Claim 1.

Considerable advantages are gained with the aid of the invention.

Using the method according to the invention, it is possible to manufacture high quality and reliable electrical contacts with the contact bumps or other contact areas of the component. This is based on the fact that when manufacturing the contacts it is possible to use, for example, some microvia method that is known in the circuit-board industry and has been found to be reliable. The contacts can also be manufactured, for example in such a way that the contact areas are first cleaned with the aid of a laser or plasma, after which metal is grown in the contact openings, using a chemical and/or electrochemical metallization method.

The method also permits components to be connected directly to the conductor layer that is immediately on the surface of the insulating layer that is the base material of the circuit board. The method also permits the precise alignment of components and contacts, as the components can be aligned directly with the contact openings, i.e. the holes that are made in the conductor layer, prior to the attachment of the component.

In some embodiments, the successful alignment of the component can even be checked through the contact openings, before the component is finally enclosed within the circuit board or other electronic module. This has the advantage that, at this stage, a wrongly aligned component can still be detached from the construction and realigned, or alternatively all the components of the module can be detached and reused in another electronic module. In this way, it is possible to achieve additional savings when manufacturing electronic modules, in which expensive components are embedded.

In the methods according to the embodiments, the number of conductor-pattern layers of an electronic module can be selected according to the current requirement. For example, there can be one or two conductor-pattern layers. On top of these, it is also possible to manufacture additional conductor-pattern layers in the manner known in the circuit-board industry. In the entire module, there can thus be, for example, one, two, four, or six conductor-pattern layers. Usually, an even number of conductor-pattern layers are made, but it is certainly also possible to manufacture an odd number of conductor-pattern layers.

In some embodiments, the conductive capacity of the construction can also be improved, by placing some of the components towards the second surface of the conductor layer of the insulating layer of the base material, in which case the active surfaces of components will face towards both surfaces of the board.

In the following, the invention is examined with the aid of examples and with reference to the accompanying drawings.

FIGS. 1-11 show a series of cross-sections of manufacturing methods according to first embodiments.

FIGS. 12-28 show a series of cross-sections of manufacturing methods according to second embodiments.

Figure 1:
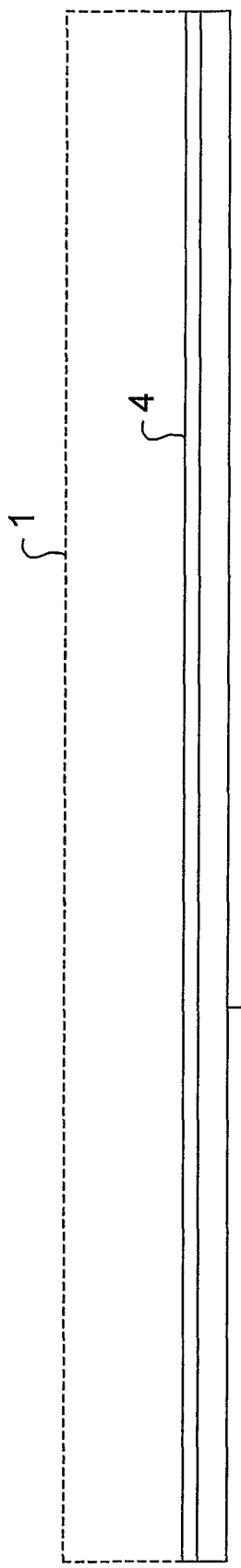

In the methods according to the embodiments, manufacturing can commence, for example, form a bare conductor layer 4, which can be, for example, a metal layer. One applicable manufacturing material for the conductor layer 4 is, for example, copper foil (Cu). If the conductor layer 4 selected for the process is very thin, or if the conductor layer is not mechanically durable for other reasons, it is recommended that the conductor layer 4 be supported with the aid of a support layer 12. It is then possible to proceed, for example, by commencing the process from the manufacture of the support layer 12. The support layer 12 can be, for example, an electrically conductive material, such as aluminium (Al), steel, or copper, or an insulating material, such as a polymer. An unpatterned conductor layer 4 can be made on the second surface of the support layer 12, for example, by using some manufacturing method that is well known in the circuit-board industry. The conductor layer can be made, for example, by laminating copper foil (Cu) on the surface of the support layer 12. Alternatively, it is possible to proceed in such a way that the support layer 12 is made on the surface of the conductor layer 4. The conductor layer 4 can also be a coated metal layer, or some other membrane containing several layers or several materials.

Manufacture can also be commenced, for example, from a conductor layer 4 that has an insulating-material layer 1 on its first surface. In that case, the first surface is the surface on the side to which the component, which is being embedded inside the insulating layer 1, is attached. In some embodiments, on the side opposite to this insulating layer 1, there can be yet another conductor layer 4. If a support layer 12 is used in the embodiment, the support layer 12 will be on the surface opposite to the conductor layer 4, i.e. on the first surface. Holes or recesses 2 are then made in the insulating-material layer 1, for the components to be embedded. The recesses 2 can be made either before the insulating layer 1 and the conductor layer 4 are attached to each other, or after the attaching. In the manufacture of the recess 2, it is possible to use some known machining method known in the circuit-board industry, for example, milling or laser drilling.

Before the attachment of the component 6, contact openings 17 are made in the conductor layer 4 at the positions of the contact areas 7 of the component 6. The contact openings 17 can be made, for example, by drilling with the aid of a laser. The mutual positions of the contact openings 17 are selected according to the mutual positions of the contact areas 7 of the component while the location and position of each group of contact openings are selected in such a way that the component will be positioned correctly relative to the entire electronic module. Thus, one contact opening 17 is made for each contact area 7 participating in the creation of an electrical contact. The surface area of the contact openings 17 being manufactured can be more or less as great as the surface area of the corresponding contact area 7. Of course, the surface area of the contact opening 17 can also be chosen to be smaller, or in some embodiments slightly larger than the surface area of the corresponding contact area 7.

The contact openings 17 can be drilled from the direction of the first or the second surface. If a support layer 12 is used in the embodiment, and is thus on the second surface of the conductor layer, it can be advantageous to drill the contact openings 17 from the direction of the first surface, because in that case the openings to be drilled do not need to penetrate the support layer 12 entirely. In such an embodiment, the contact openings 17 open later, when the support layer 12 is detached. The contact openings can also be opened in such a way that the material layer formed by the conductor layer 4 and the support layer 12 are thinned by etching from the direction of the support layer. The conductor layer 4 and the support layer 12 can also be formed from a single material layer. In that case, the part of the material layer corresponding to the support layer 12 is removed and the contact openings 17 open. The contact opening 17 is thus intended to extend through the entire conductor layer 4.

The components 6 are attached to the surface of the conductor layer 4 with the aid of an adhesive. For gluing, an adhesive layer 5 is spread on the attachment surface of the conductor layer 4, or the attachment surface of the component 6, or on the attachment surfaces of both. After this, the components 6 can be aligned to the positions planned for the components 6, with the aid of alignment marks.

The term attachment surface of the component 6 refers to that surface of the component 6, which faces towards the conductor layer 4. The attachment surface of the component 6 consists of contact areas, through which an electrical contact can be formed to the component. The contact area can be, for example, flat areas on the surface of the component 6, or more usually contact protrusions protruding from the surface of the component 6. There are generally at least two contact areas or protrusions in the component 6. In complex microcircuits, there can be a great many contact areas.

In many embodiments, it is preferable to spread so much adhesive on the attachment surface or attachment surfaces that the adhesive fills the space remaining between the component 6 and the conductor layer 4. In that case, a separate filler agent will not be required. Filling the space remaining between the components 6 and the conductor layer 4 reinforces the mechanical connection between the component 6 and the conductor layer 4, so that a mechanically more durable construction will be achieved. A comprehensive and unbroken adhesive layer will also support the conductor patterns 14 to be formed later form the conductor layer 4 and protect the construction in the later process stages. During gluing, adhesive will also enter the contact openings 17.

The term adhesive refers to a material, by means of which the components are attached to the conductor layer. One property of the adhesive is that the adhesive can be spread on the surface of the conductor layer and/or of the component in a relatively liquid form, or in one that otherwise conforms to the surface shapes, for example, in the form of a membrane. Another property of the adhesive is that after spreading the adhesive hardens or can be hardened at least partly, in such a way that the adhesive can hold the component in place (relative to the conductor layer) at least until the component is attached to the construction in some other way. A third property of the adhesive is its adhesive ability, i.e. its ability to adhere to the surface being glued.

The term gluing refers to attaching the component and the conductor layer to each other with the aid of an adhesive. In gluing, the adhesive is thus brought between the component and the conductor layer and the component is placed in a suitable position relative to the conductor layer, in which the adhesive is in contact with the component and the conductor layer and at least partly fills the space between the component and the conductor layer. After this, the adhesive is allowed to harden (at least partly), or the adhesive is actively cured (at least partly), in such a way that the component is attached to the conductor layer with the aid of the adhesive. In some embodiments, the contact protrusions of the component may, during the gluing, protrude through the adhesive layer, to make contact with the conductor layer.

The adhesive used in the embodiments is, for example, a thermally hardening epoxy. The adhesive is selected in such a way that the adhesive being used has sufficient adhesion to the conductor membrane, the circuit board, and the component. One preferred property of the adhesive is a suitable thermal expansion coefficient, so that during the process the thermal expansion of the adhesive will not differ too greatly from that of the surrounding material. The adhesive selected should also preferably have a short hardening time, preferably of a few seconds at most. In this time the adhesive should harden at least partly, so that the adhesive will be able to hold the component in place. The final hardening can take clearly more time and can indeed be planned to take place in connection with a later process stage. The adhesive should also withstand the process temperatures used, for example, heating to a temperature of 100-265° C. a few times, and other manufacturing-process strain, for example, chemical or mechanical strain. The adhesive preferably has an electrical conductivity that is of the same order as that of insulating materials.

A suitable insulating-material layer 1 is selected as the base material of the electronic module, for example, a circuit board. The insulating-material layer 1 can be, for example, a polymer base, such as a glass-fibre-reinforced epoxy sheet FR4. Other examples of suitable materials for the insulating-material layer 1 are PI (polyimide), FR5, aramid, polytetrafluoroethylene, Teflon®, LCP (liquid crystal polymer), and a precured binder layer, i.e. prepreg.

Using a suitable method, recesses or vias, selected according to the size and mutual position of the components 6 glued to the conductor layer 4, are made in the insulating-material layer 1. The recesses or vias can also be made slightly larger than the components 6, in which case the alignment of the insulating-material layer 1 relative to the conductor layer 4 will not be so critical. If in the process an insulating-material layer 1, if which vias are made for the components 6, is used, certain advantages can be gained by using additionally a separate insulating-material layer 11, in which holes are not made. Such an insulating-material layer 11 can be located on top of the insulating-material layer 1, to cover the vias made for the components.

The insulating-material layer 1 can also be made after the gluing of the component 6, in which case insulating material in a liquid form is spread on top of the conductor layer and the component 6, or a partly unhardened insulating-material layer is placed on them. After this, the insulating material is cured, which creates the insulating-material layer 1.

If a second conductor layer is desired in the electronic module being manufactured, this can be made, for example, on the surface of the insulating-material layer 1. In embodiments, in which a second insulating-material layer 11 is used, the conductor layer can be made on the surface of this second insulating-material layer 11. Conductor patterns 19 can be made from the second conductor layer 9. The conductor layer 9 can be made, for example, in a similar manner to the conductor membrane 4. However, it is not necessary to made a second conductor membrane 9 in simple embodiments and when making simple electronic modules. A second conductor membrane 9 can, however, be exploited in many ways, such as an additional space for conductor patterns and components 6 and protecting the entire module from electromagnetic radiation (EMC protection). A second conductor membrane 9 can also be used to reinforce the structure and reduce, for example, warping of the installation base.

Vias are made in the electronic module, through which electrical contacts can be formed between the contact areas of the components 6 and the conductor layer 4. For the making of the vias, the contact openings 17 are cleaned of adhesive and other materials that may have entered the openings. This is naturally performed from the direction of the second surface of the conductor material 4, as the components are glued to the first surface. In connection with the cleaning of the contact openings, it is also possible to clean the contact areas 7 of the components 6, which will further improve the preconditions for the manufacture of a high-quality electrical contact. Cleaning can take place, for example, using plasma technology, chemically, or with the aid of a laser. If the contact openings 17 and the contact areas are already sufficiently clean, cleaning can naturally be omitted.

After cleaning, it is also possible to check the success of the alignment of the components 6, as the contact areas 7 of a correctly aligned component will appear through the contact openings 17, when viewed from the direction of the conductor layer 4.

After this, a conductor material is brought to the holes 17, in such a way that an electrical contact is formed between the components 6 and the conductor layer 4. The conductor material can be made, for example, by filling the contact openings with a conductive paste. The conductor material can also be made using one of the several growing methods known in the circuit-board industry. At the present moment, the best electrical contacts are made by forming a metallurgical joint, for example, by growing the conductor material using a chemical or electrochemical method. The intention is thus to always use such methods, at least in the most demanding embodiments. One good alternative is to grow a thin layer using a chemical method and to continue the growth with a more economical electrochemical method. In addition to these methods, it is of course also possible to use some other method, which is advantageous in terms of the final result.

Figure 2:
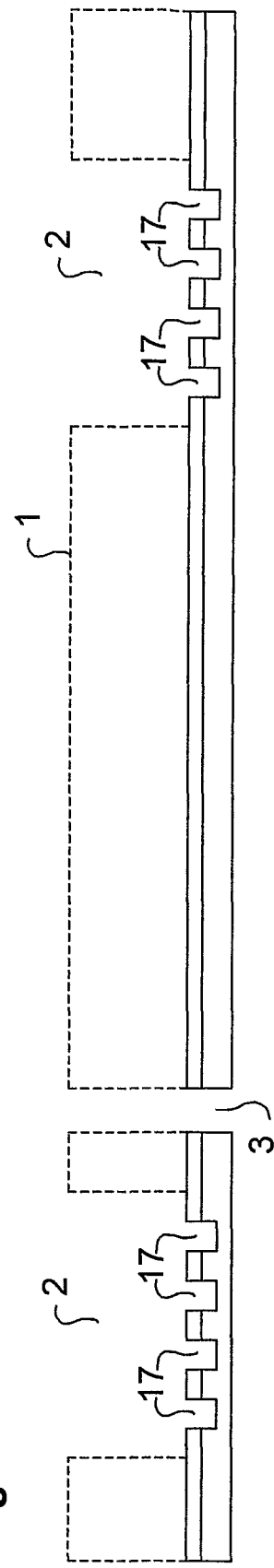
Figure 3:
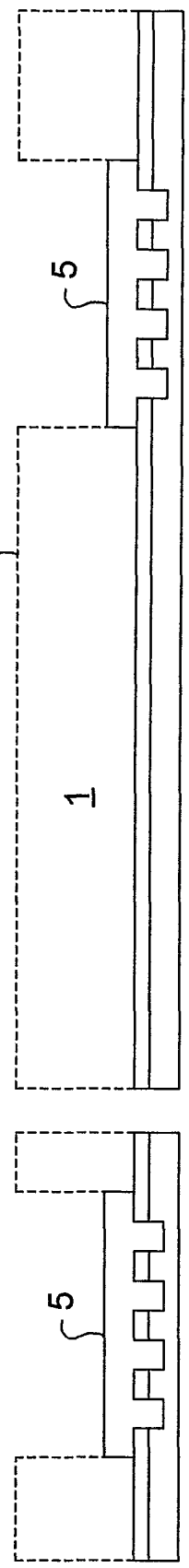
Figure 7:
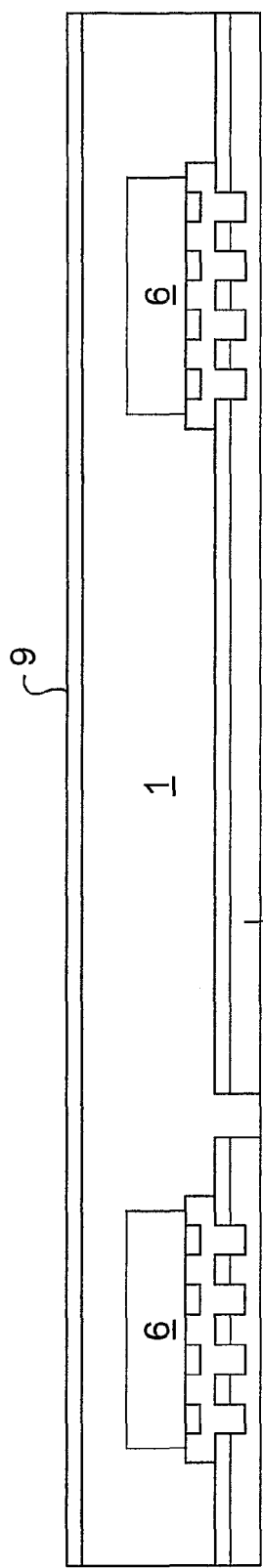
Figure 8:
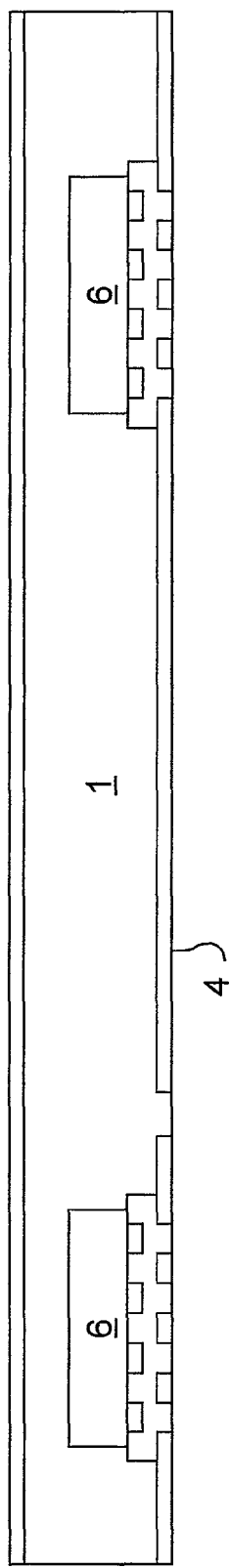
Figure 9:
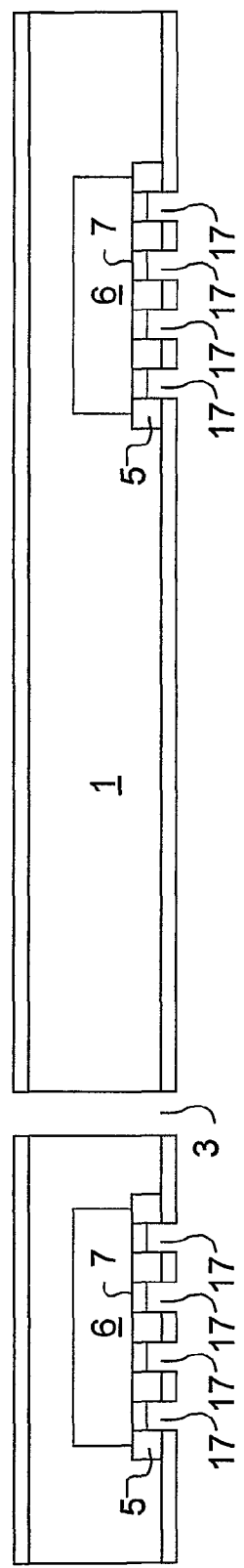
Figure 10:
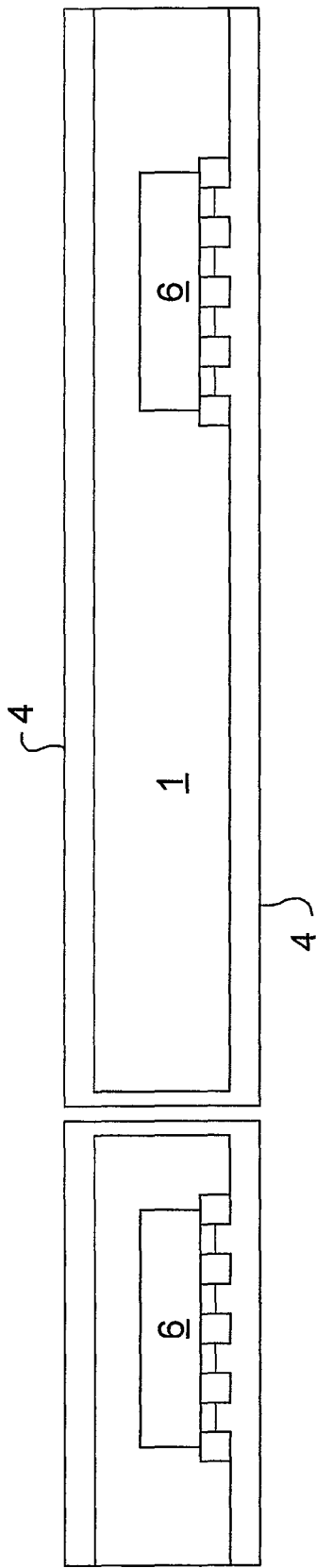
Figure 11:
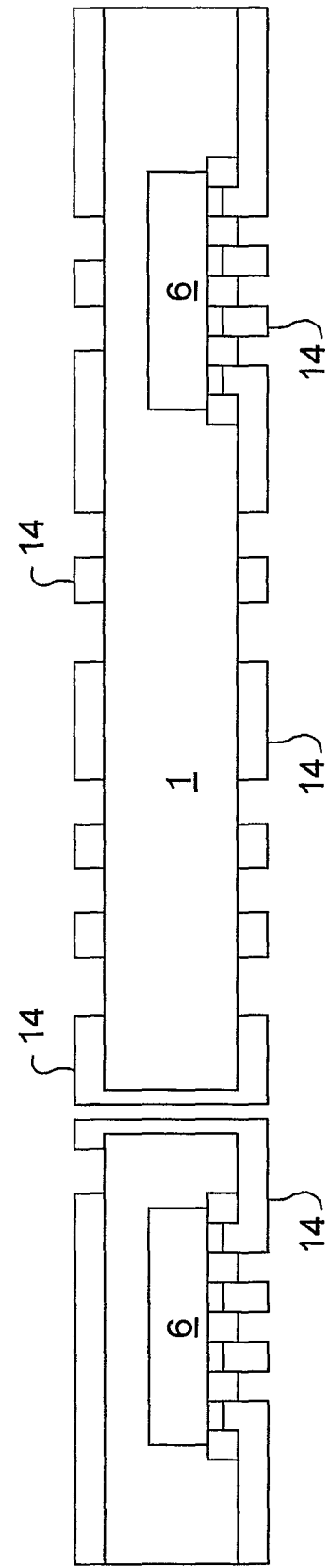

In the following, some possible embodiments will be examined in greater detail, with the aid of the procedural stages shown in FIGS. 1-11.

Stage A (FIG. 1):

In stage A, a suitable conductor layer 4 is selected as the starting material for the process. A layered sheet, in which the conductor layer 4 is located on the surface of a support base 12, can also be selected as the starting material. The layered sheet can be manufactured, for example, by taking a support base 12 suitable for processing and attaching a suitable conductor membrane to the surface of this support base 12, for the creation of a conductor layer 4.

The support base 12 can be, for example, of an electrically conductive material, such as aluminium (Al), or of an insulating material, such as a polymer. The conductor layer 4 can be created, for example by attaching thin metal foil to one surface of the support base 12, for example, by laminating it from copper (Cu). The metal foil can be attached to the support base, for example, by using an adhesive layer, which is spread on the surface of the support base 12 or metal foil, prior to the lamination of the metal layer. At this stage, there need be no patterns in the metal foil.

In the embodiments, it is thus also possible to use a self-supporting conductor layer 4, in which case the support layer 12 is totally omitted. The figures also show an embodiment, in which there is an insulating layer 1 of the first surface of the conductor layer 4. In order to distinguish the embodiments from each other, the insulating layer 1 is shown in FIGS. 1-4 with the aid of a broken line. A support layer 12 can also be used, or not used in these embodiments, in which there has been an insulating layer 1 on the surface of the conductor layer 4 from the very start.

Stage B (FIG. 2):

Contact openings 17 are made form the vias required by the electrical contacts of the components. The contact openings 17 are made through the conductor layer 4, for example, with a laser or mechanically by drilling. In the embodiment of the figure, the contact openings 17 are drilled form the direction of the first surface of the conductor layer and extend to the material of the support layer 12. In the embodiment of the figure, a via 3, which can be used as an aid in aligning, is made in addition to the contact openings 17.

In the embodiment shown by a broken line, the recesses 2 for the components must also be made in the insulating layer 1 in this stage.

Stage C (FIG. 3):

In stage C, an adhesive layer 5 is spread on the conductor layer 4, in the areas to which the components 6 are to be attached. These areas can be termed connection areas. The adhesive layers 5 can be aligned, for example, with the aid of the contact openings 17. The thickness of the adhesive layer is selected in such a way that the adhesive completely fills the space between the component 6 and the conductor layer 4, when the component 6 is pressed onto the adhesive layer 5. If the component 6 includes contact protrusions 7, the thickness of the adhesive layer 5 should be greater, for example, about 1.1-10 times, than the height of the contact protrusions 7, so that the space between the component 6 and the conductor layer 4 will be well filled. The surface area of the adhesive layer 5 formed for the component 6 can also be slightly greater than the corresponding surface area of the component 6, which will also help to reduce the risk of inadequate filling.

Stage C can be modified in such a way that the adhesive layer 5 is spread on the connector surfaces of the components 6, instead of on the connector areas of the conductor layer 4. This can be performed, for example, in such a way that the component is dipped in adhesive before it is assembled in place in the electronic module. It is also possible to proceed by spreading the adhesive on both the connector areas of the conductor layer 4 and on the connector surfaces of the components 6.

The adhesive used is thus an electrical insulator, so that electrical contacts between the contact areas 7 of the components 6 do not arise in the adhesive layer 5 itself.

Stage D (FIG. 4):

In stage D, the components 6 are set in place in the electronic module. This can be done, for example, by using the aid of an assembly machine to press the components 6 into the adhesive layer 5. In the assembly stage, the components 6 can be aligned accurately with the aid of the contact openings 17. In more approximate alignment, it is also possible to use the vias 3 or other available alignment marks, if such have been made in the board.

The components 6 can be glued singly, or in suitable groups. The typical procedure is for the conductor layer, which can be referred to as the bottom of the installation base, to be brought to a suitable position relative to the assembly machine, after which the component 6 is aligned and pressed onto the bottom of the installation base, which is held stationary during alignment and attachment.

Stage E (FIG. 5):

An insulating-material layer 1, in which there are ready-made holes 2 or recesses for the components 6 glued to the conductor layer 4, is placed on top of the insulating-material layer 4. The insulating-material layer 1 can be manufactured from a suitable polymer base, in which holes or recesses, selected according to the size and position of the components 6, are made using some suitable method. The polymer base can be, for example, a pre-preg base, which is known and widely used in the circuit-board industry. The material alternatives for the insulating-material layer 1 are described in greater detail in connection with stage 2A.

It is good to perform stage E only after the adhesive layer 5 has been cured, or otherwise hardened sufficiently for the components 6 to remain in place while the insulating-material layer 1 is set in place.

The insulating-material layer 1 can also be made in such a way that a sheet of insulating material, which is hardened later, with no holes in it is placed on top of the component and the conductor layer 4. Such a sheet can be, for example, suitably selected prepreg. The insulating-material layer 1 can also be made in such a way that an insulating material, which is later hardened, is spread in a liquid form on top of the component and the conductor layer 4.

In the embodiment shown with the aid of a broken line, stage E can naturally be omitted, because in the embodiment there is already an insulating-material layer on top of the conductor layer 4.

Stage F (FIG. 6):

In stage F, an unpatterned insulating-material layer 11 is set on top of the insulating-material layer 1 and then a conductor layer 9 is set on top of it. Like the insulating-material layer 1, the insulating-material layer 11 can be manufactured from a suitable polymer membrane, for example, from the aforementioned pre-preg base. The conductor layer 9 can be, for example, copper foil, or some other membrane suitable for the purpose.

Stage F is advantageous in embodiments, in which the insulating-material layer 1 contains open holes 2 around the components 6 and also if it is desired to attach a conductor layer 9 to the opposite side of the insulating-material layer 1. The insulating material 11 will then fill the openings 2 of the components and secure the conductor layer 9 and the insulating-material layer 1 to each other. It is also possible to proceed in such a way that the openings 2 are filled with a separate filler. If, on the other hand, the insulating-material layer 1 is formed after the gluing of the components 6, the layer 1 will already automatically be unified. In that case, the second conductor layer 9 can be attached to the electronic module directly against the insulating-material layer 1, before the layer 1 is cured.

Stage F is thus advantageous in some embodiments, but in most embodiments can just as well be omitted or replaced with another kind of procedure.

Stage G (FIG. 7):

In this stage, the layers 1, 11, and 9 are pressed with the aid of heat and pressure; in such a way that the polymer (in the layers 1 and 11) forms a unified and tight layer around the components 6 between the conductor layers 4 and 9. This procedure makes the second conductor layer 9 quite even and flat.

When manufacturing simple electronic modules including a single conductor pattern layer 14, stage F can even be entirely omitted, or the layers 1 and 11 can be laminated to the structure without the conductor layer 9.

Stage G is thus closely related to stage F, so that the modifications presented above in connection with stage F also concern stage G.

Stage H (FIG. 8):

In this stage, the support base 12 is detached or otherwise removed from the structure. The removal can take place, for example, mechanically or by etching. Naturally, stage H can be omitted in embodiments in which a support base 12 is not used.

In an embodiment, in which there is a thick unbroken conductor layer (4 and 12 together) on the surface of the insulating-material layer 1, in stage H it is possible to etch off a portion of the conductor layer, corresponding to the support base 12.

In stage H the contact openings 17 open out on the second surface of the conductor layer 4. The contact openings 17 are then, however, generally filled with adhesive 5.

Stage I (FIG. 9):

The contact openings 17 are cleaned of adhesive using a suitable method, for example, chemically, with a laser, or by plasma etching. At the same time, the contact areas 7 of the component are cleaned, which are located on the 'bottom' of the contact openings 17. In some embodiments, cleaning can be omitted.

In stage I, it is also possible, if desired, to make other holes, for example, a hole 3 for a via penetrating the insulating-material layer 1.

Stage J (FIG. 10):

In stage I, conductor material is grown in the contact openings 17. In the example process, the conductor material is grown at the same time also elsewhere on top of the base, thus increasing the thickness of the insulating layers 4 and 9 too. If desired, conductor material can also be grown in the hole 3.

The conductor material to be grown can be, for example, copper, or some other sufficiently electrically conductive material. The selection of the conductor material takes into account the ability of the material to form an electrical contact with the material of the contact protrusions 7 of the component 6. In one example process, the conductor material is mainly copper. The copper metallizing can be performed by depositing a thin layer of chemical copper in the holes 17 and then continuing plating using an electrochemical copper-growing method. Chemical copper is used in the example because it will also form a deposit on top of the adhesive and act as an electrical conductor in electrochemical plating. The metal can thus be grown using a wet-chemical method, so that the growing is cheap and the conductor structure is of good quality.

Stage J is intended to form an electrical contact between the component 6 and the conductor layer 4. Thus, in stage J it is not essential to increase the thickness of the conductor layers 4 and 9, but instead the process can equally well be designed so that in stage J the holes 17 are only filled with a suitable material. The electrical contact can be made, for example, by filling the contact openings 17 with an electrically conductive paste, or by using some other suitable microvia metallizing method.

Stage K (FIG. 11):

In stage K, the desired conductor patterns 14 and 19 are made from the conductor layers 4 and 9 on the surfaces of the base. If in the embodiment only the conductor layer 4 is used, the patterns are formed only on one side of the base. It is also possible to proceed by forming conductor patterns only from the conductor layer 4, even though a second conductor layer 9 is used in the embodiment. In such an embodiment, the unpatterned conductor layer 9 can act, for example, as a layer that supports or protects the electronic module mechanically, or as protection against electromagnetic radiation.

The conductor patterns 14 can be made by removing the conductor material of the conductor layer 4 from outside the conductor patterns. The conductor material can be removed, for example, using some of the patterning and etching methods that are widely used and well known in the circuit-board industry.

After stage K, the electronics module includes a component 6, or several components 6, as well as conductor patterns 14 and 19 (in some embodiments, only the conductor patterns 14), with the aid of which the component 6, or components can be connected to an external circuit, or to each other. The preconditions then exist for manufacturing an operational totality. The process can thus be designed in such a way that the electronic module is ready after stage K and FIG. 11 indeed shows an example of one possible electronic module. If desired, the process can also be continued after stage K, for example, by coating the electronic module with a protective agent, or by manufacturing additional conductor pattern layers on the first and/or second surface of the electronic module.

Figure 12:
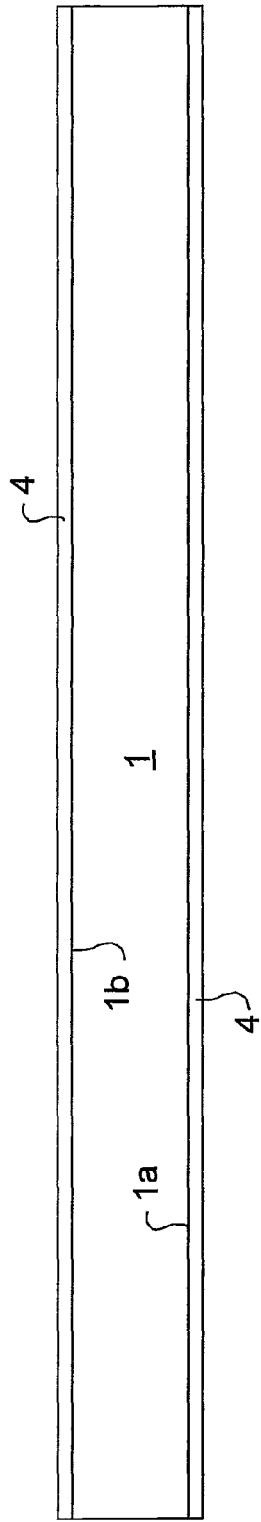
Figure 13:
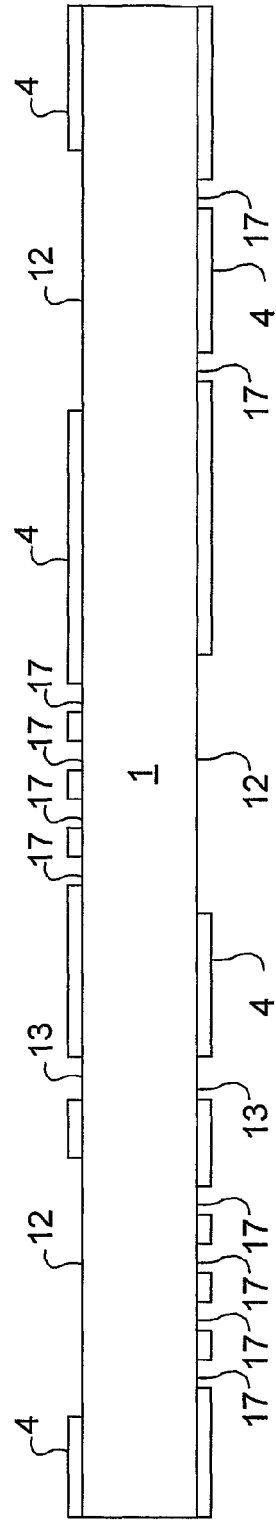
Figure 14:
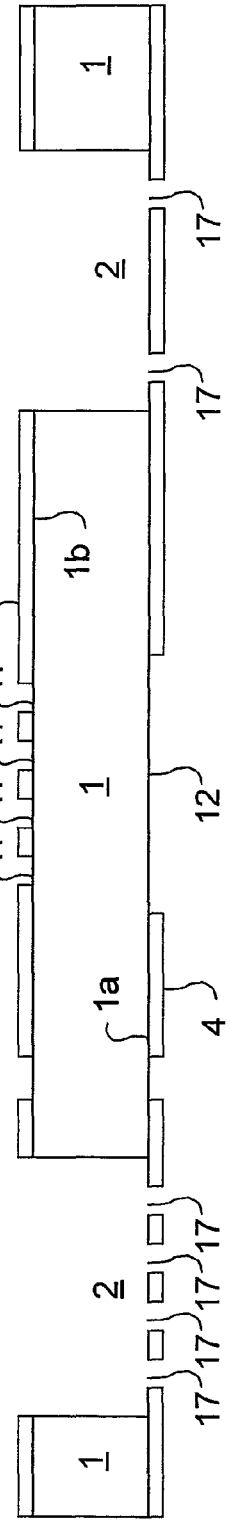
Figure 18:
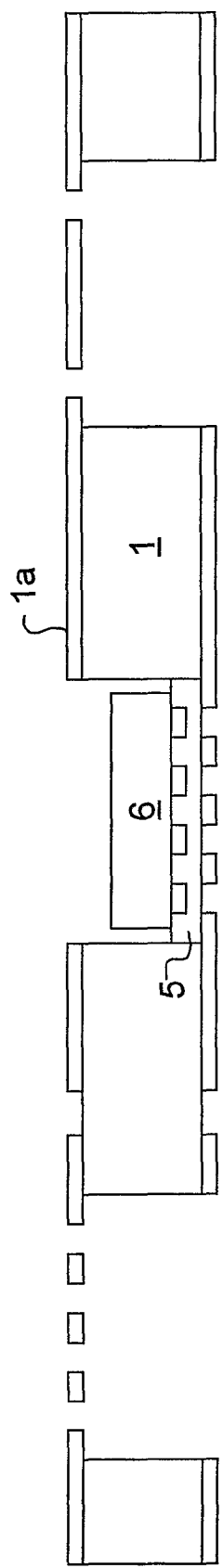
Figure 19:
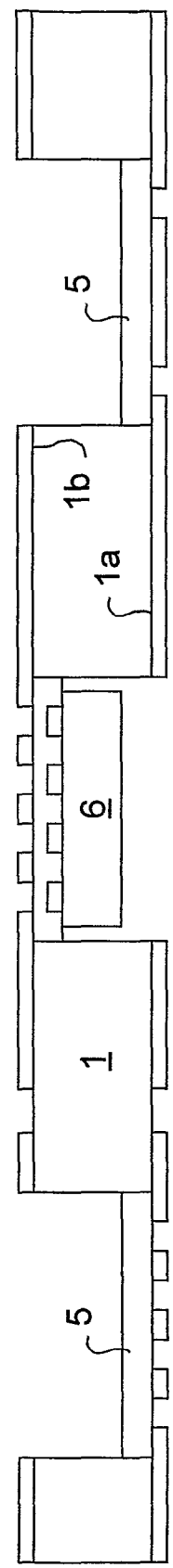
Figure 20:
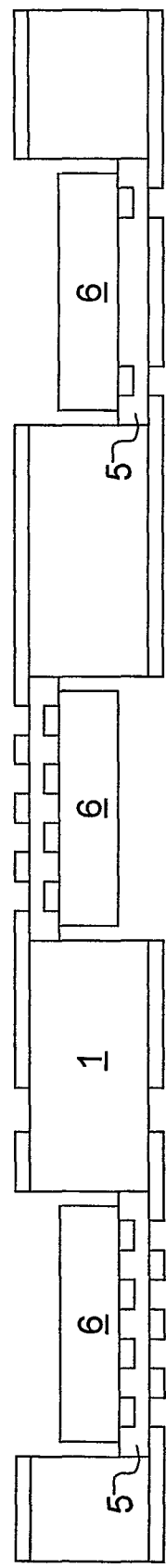
Figure 21:
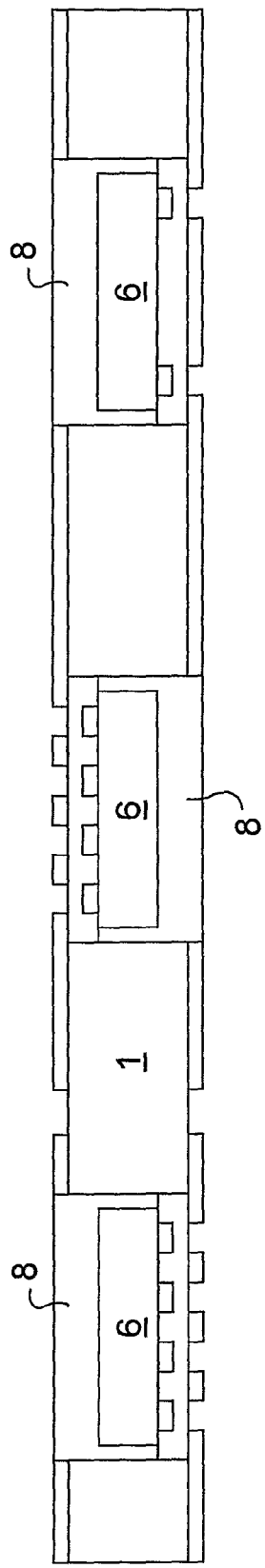
Figure 22:
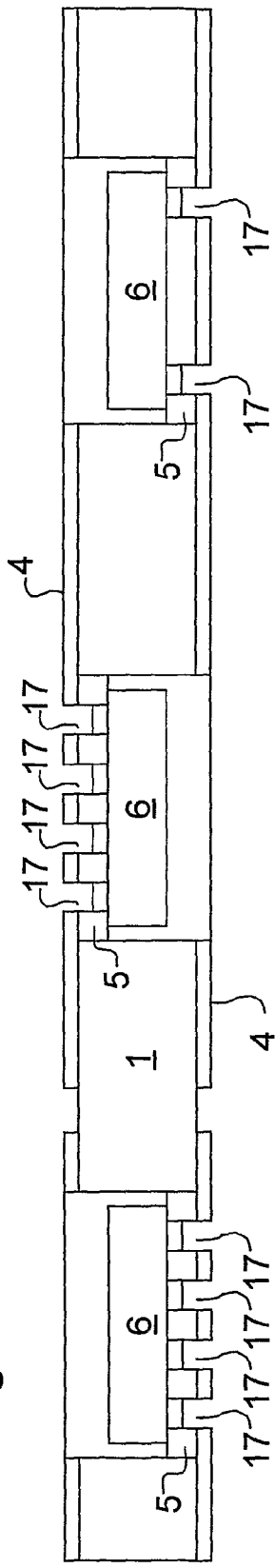
Figure 23:
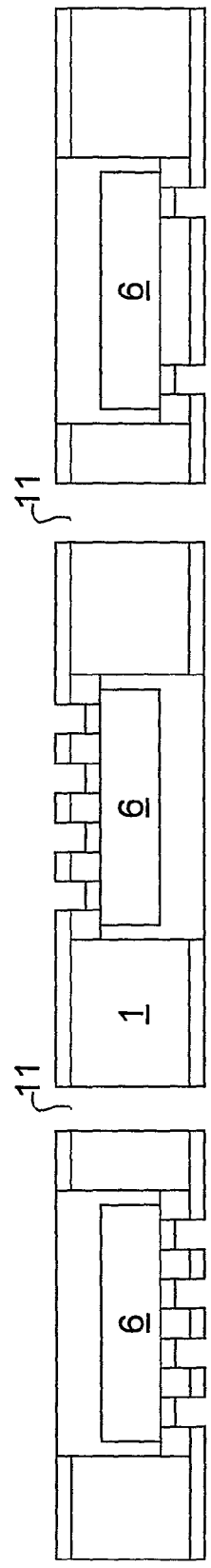
Figure 24:
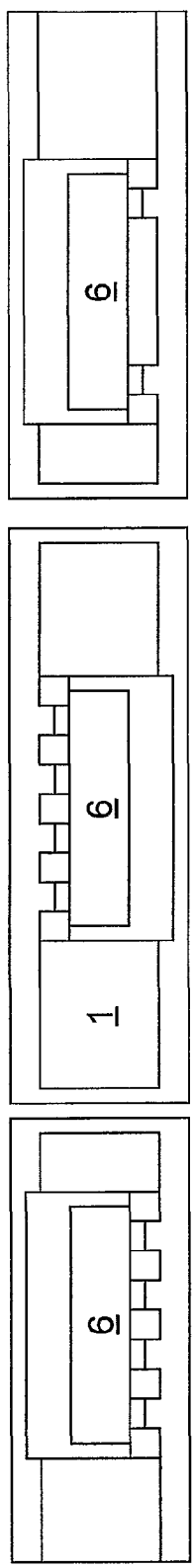
Figure 25:
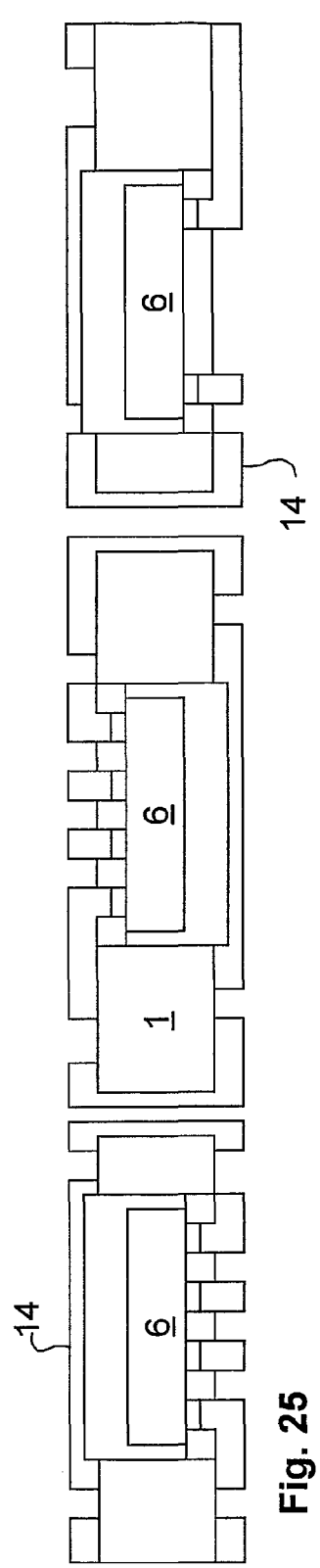
Figure 26:
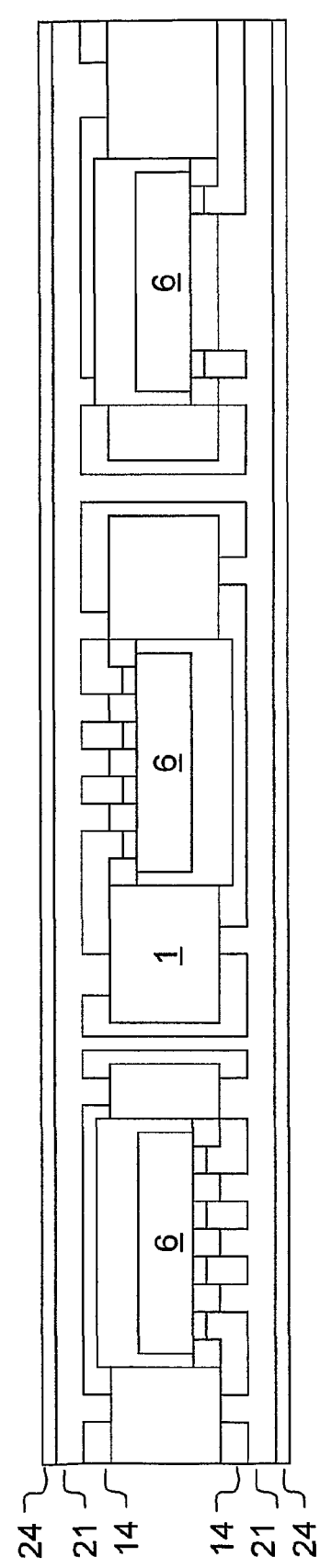
Figure 27:
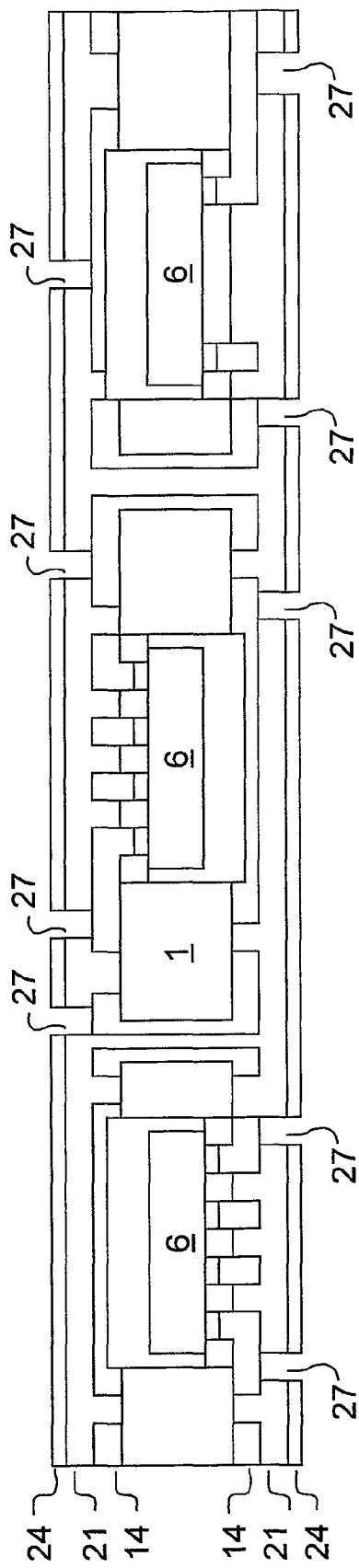
Figure 28:
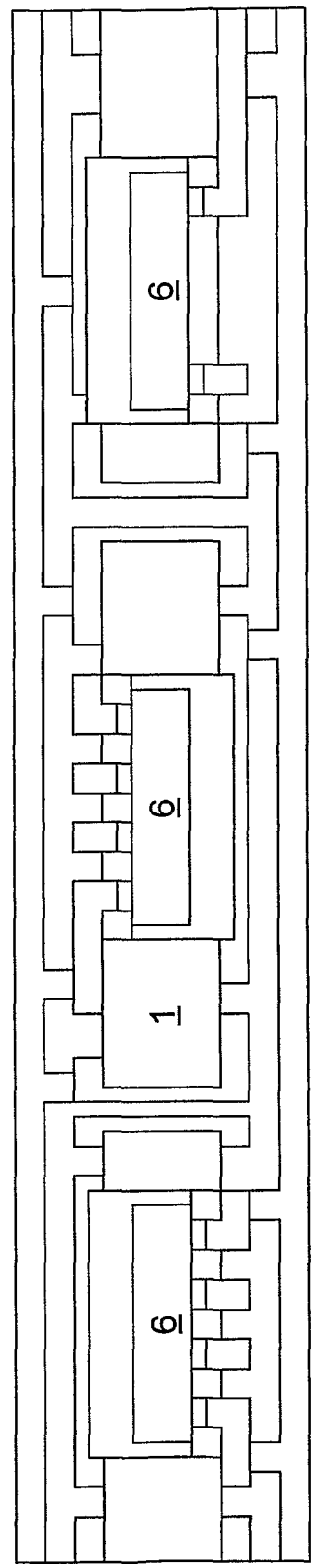

In the following, some other possible embodiments are examined with the aid of the method stages shown in FIGS. 12-28.

Stage 2A (FIG. 12):

A suitable insulating-material sheet 1, from which the body of the installation base is formed, is selected for the manufacturing process of the electronic module. In embodiments using a single insulating-material layer, the thickness of the insulating-material layer 1 must be preferably greater than the thickness of the component being installed. Thus it is possible to embed the components entirely inside the installation base while the electronic module will have flat surfaces on both sides. Of course, thicker special components, the surface of which will extend outside of the insulating-material layer 1, can also be embedded in the installation base. This is a preferable procedure, especially in such embodiments, in which several insulating-material layers are used, which are joined together during the process. The components can then be entirely embedded in the structure, provided the total thickness of the insulating-material layers exceeds the thickness of the component. This is because it is preferable, on account of the durability of the construction, for the components in the electronic module to be located entirely inside the installation base.

In this case, the term pre-preg refers to a basic material of the circuit-board industry, which is generally a glass-fibre-reinforced insulating mat impregnated with a B-stage resin. Typically a pre-cured binder layer is used as a binding insulating agent when manufacturing multi-layer circuit boards. Its B-stage resin is cross-bridged in a controlled manner with the aid of heat and pressure, for example, by pressing or lamination, when the resin hardens and becomes C-stage. In a controlled curing cycle, during the rise in temperate the resin softens and its viscosity drops. Compelled by pressure, the liquid resin fills the holes and openings in its interface. When using a precured binder layer as an insulating material, this property is exploited to fill the empty space remaining around the components. In this way, it is possible to further simplify the electronic module manufacturing method disclosed in the example, as there is no need to fill the installation recesses of the components with a separate filler.

The insulating-material layer 1 is surfaced on both sides 1$a$, 1$b$ with a conductor layer 4, for example, a metal layer. The manufacturer of the electronic module can also select a ready-surfaced insulating sheet as the initial material.

Stage 2B (FIG. 13):

Holes are formed in the conductor layers 4, using some suitable method. The holes can be made, for example, by vaporization with a laser, or some selective etching method, which are widely used and well known in the circuit-board industry. The holes being made are contact openings 17 for the vias required by the electrical contacts of the component and openings 12 for the manufacture of the installation recesses 2 of the components. In addition, it is possible if desired to make holes 13 for the manufacture of the vias. The holes 12, 13, 17 are made in such a way that the surface of the insulating-material layer 1 is revealed.

Stage 2C (FIG. 14):

Recesses 2 of a suitable size and shape for the components to be embedded in the board are made in the insulating-material layer 1. The recesses 2 can be suitably made, for example, using some known method used in the circuit-board industry. The recesses 2 can be made, for example, by the $CO_2$-laser ablation method, by chemical etching, or by mechanical milling. The recesses 2 are made from the direction of the second surface 1$b$ and extend through the entire insulating-material layer 1, right to the surface 1$a$ of the conductor-material layer 4 on the opposite surface of the layer.

The recesses 2 can be made in such a way that the conductor layer 4 on the surface of the insulating-material layer 1 closes one or other end of the recess. It is thus possible to use some suitable selective method, which is effective is the insulating material 1 but not in the conductor layer 4. Thus the recess 2 being made will extend through the entire insulating-material layer 1, but the conductor layer 4 and the other end of the recess 2 will remain undamaged. The recesses 2 can be made in a corresponding manner from the direction of both surfaces of the installation base.

Stage 2D (FIG. 15):

The electronic-module blank is turned the other way round.

Stage 2E (FIG. 16):

Additional installation recesses 2 for components are made in the insulating-material layer 1, for the direction of the first surface 1$a$. Otherwise, the recesses 2 can be made in the manner of stage 2C. If the recesses 2 are made chemically by etching, the recesses 2 can be made in both surfaces simultaneously.

Stage 2F (FIG. 17):

An adhesive layer 5 is spread on the conductor layer 4, in the areas to which the components 6 are to be attached. These areas can be termed connection areas. In practice, the connection areas are located on the 'bottom' of the recesses 2. The thickness of the adhesive layer is selected in such a way that the adhesive completely fills the space between the component 6 and the conductor layer 4, when the component 6 is pressed onto the adhesive layer 5. If the component 6 includes contact protrusions 7, the thickness of the adhesive layer 5 should be greater, for example, about 1.5-10 times, than the height of the contact protrusions 7, so that the space between the component 6 and the conductor layer 4 will be well filled. The surface area of the adhesive layer 5 formed for the component 6 can also be slightly greater than the corresponding surface area of the component 6, which will also help to reduce the risk of inadequate filling.

The stage can be modified in such a way that the adhesive layer 5 is spread on the connector surfaces of the components 6, instead of on the connector areas of the conductor layer 4. This can be performed, for example, in such a way that the component is dipped in adhesive before it is assembled in place in the electronic module. It is also possible to proceed by spreading the adhesive on both the connector areas of the conductor layer 4 and on the connector surfaces of the components 6.

The adhesive used in the embodiments is thus an electrical insulator, so that electrical contacts between the contact areas 7 of the components 6 do not arise in the adhesive layer 5 itself.

Stage 2G (FIG. 18):

The components 6 are set in place in the electronic module from the direction of the first surface 1a. This can be done, for example, by using the aid of an assembly machine to press the components 6 into the adhesive layer 5. The components 6 can be aligned accurately with the aid of the contact openings 17, as described in stage D.

Stage 2H (FIG. 19):

The electronic-module blank is turned the other way round (cf. Stage 2D).

Stage 2I (FIG. 19):

An adhesive layer 5 is spread on the bottom of the installation recesses 2 opening onto the second surface 1b. Stage 2I is performed correspondingly to stage 2F, but from the direction of the opposite surface of the electronic module.

In principle, it is possible to perform the work stages (e.g., stages 2F and 2I) to be carried out on the opposite side of the electronic module also simultaneously or sequentially without turning the blank, if the manufacturing equipment being used permits the work stages to be made from two directions.

Stage 2J (FIG. 20):

In stage J, the components 6 to be placed from the direction of the second surface 1b are set in place in the electronic module correspondingly to stage 2G.

Stage 2K (FIG. 21):

In stage K, the space remaining between the components 6 and the installation base is filled entirely with a filler agent 8, which is, for example, some suitable polymer.

Stage 2L (FIG. 22):

The contact openings 17 are cleaned of adhesive using a suitable method, for example, chemically, with a laser, or by plasma etching. At the same time, the contact areas 7 of the component are cleaned, which are located on the 'bottom' of the contact openings 17.

Stage 2M (FIG. 23):

Stage 2M is performed, if it is wished to make other holes, for example, a hole 11 penetrating the insulating-material layer 1 for a via.

If the material of the insulating-material layer 1 is a hardened, C-stage material, the holes 11 can be made in connection with an earlier stage, for example, stage 2C or 2E.

Stage 2N (FIG. 24):

Conductor material is grown in the contact openings 17. In the example process, the conductor material is grown at the same time also elsewhere on top of the base, thus increasing the thickness of the insulating layers 4 too. If desired, conductor material can also be grown in the hole 11.

The conductor material to be grown can be, for example, copper, or some other sufficiently electrically conductive material. The selection of the conductor material takes into account the ability of the material to form an electrical contact with the material of the contact protrusions 7 of the component 6. In one example process, the conductor material is mainly copper. The copper metallizing can be performed by depositing a thin layer of chemical copper in the holes 17 and then continuing plating using an electrochemical copper-growing method. Chemical copper is used in the example because it will also form a deposit on top of the adhesive and act as an electrical conductor in electrochemical plating. The metal can thus be grown using a wet-chemical method, so that the growing is cheap and the conductor structure is of good quality.

Stage 2N is intended to form an electrical contact between the component 6 and the conductor layer 4. Thus, in stage 2N it is not essential to increase the thickness of the conductor layers 4, but instead the process can equally well be designed so that in stage 2N the holes 17 are only filled with a suitable material. The electrical contact can be made, for example, by filling the contact openings 17 with an electrically conductive paste, or by using some other suitable microvia metallizing method.

Stage 2O (FIG. 25):

In stage 2O, the conductor layers 4 are patterned in such a way that conductor patterns 14 are formed on both surfaces of the board 1. The patterning can be performed, for example, in the manner described in stage K.

After stage 2O, the electronics module includes a component 6, or several components 6, as well as conductor patterns 14, with the aid of which the component 6, or components can be connected to an external circuit, or to each other. The preconditions then exist for manufacturing an operational totality. The process can thus be designed in such a way that the electronic module is ready after stage 2O and FIG. 25 indeed shows an example of one possible electronic module. If desired, the process can also be continued after stage 2O, for example, by coating the electronic module with a protective agent, or by manufacturing additional conductor pattern layers on the first and/or second surface of the electronic module.

Stage 2P (FIG. 26):

An insulating-material layer 21 is made on both surfaces of the board 1 and a conductor layer 24 on the surface of the insulating-material layer 21. Stage 2P can be performed, for example, by pressing suitable RCF membranes on to both surface of the board 1. The RCF membrane then includes both an insulating-material layer 21 and a conductor layer 24. When the RCF membranes are pressed onto the board 1 with the aid of heat and pressure, it and the polymer of the layers 21 form a unified and dense insulating-material layer between the conductor layers 14 and 24. By this procedure the conductor layer 24 too becomes quite flat and even.

Stage 2Q (FIG. 27):

In stage Q, holes 27 are made to create vias between the conductor layers 14 and 24. The holes can be made, for example, with a laser.

Stage 2R (FIG. 28):

In stage 2R, conductor material is grown in the holes 27 and at the same time the conductor layer 24 can also be thickened. Stage 2R can be performed correspondingly to stage 2N.

After stage 2R, the process can be continued by patterning the conductor layers 24 and possibly by making additional conductor layers on either or both surfaces. Separate components can also be connected to the conductor-pattern layer on the surface of the electronic module, in the manner of conventional circuit-board technology.

The examples of the above series of figures show some possible processes, with the aid of which our invention can be exploited. However, our invention is not restricted only to the processes described above, but instead the invention also covers other various processes and their end products, taking into account the full scope and equivalence interpretation of the Claims. The invention is also not restricted to only the constructions and methods shown by the examples, but instead it will be obvious to one versed in the art that the various applications of our invention can be used to manufacture very many different kinds of electronic modules and circuit-boards, which differ even greatly from the examples described above. The components and circuits of the figures are thus shown only for the purpose of illustrating the manufacturing process. Thus many alterations can be made to the processes of the examples described above, without, however, deviating from the basic idea according to the invention. The changes can relate, for example, to the manufacturing techniques described in the different stages, or to the mutual order of the process stages.

In the processes described above it is possible, for example, to use several component attachment techniques, for example, in such a way that the components attached from the direction of the first surface are attached using some first technique while the components attached from the second direction are attached using some second technique, which differs from the said first technique.

In the examples described above, electronic modules are manufactured that include components embedded from a first and a second direction. Within the scope of the invention it is of course possible to also manufacture such simpler modules, which include components embedded form only one direction. With the aid of such simpler modules, it is also possible to manufacture a module includes components embedded in two directions. The module can be made, for example, in such a way that two modules are laminated together.

The invention claimed is:

1. Method for manufacturing an electronic module having a component which has contact areas connected electrically to a conductor-pattern layer, the method comprising the steps of:
    making contact openings in a conductor layer within a connection area, the positions of the contact openings corresponding to the positions of the contact areas of the component,
    forming an adhesive layer within the connection area;
    aligning the component and the conductor layer relative to each other, in such a way that the contact areas of the component come to the positions of the contact openings,
    securing the component to the conductor layer with the adhesive layer, the adhesive layer being in direct contact with the component and the conductor layer,
    forming conductor material in at least the contact openings and at the contact areas of the component, wherein the conductor material electrically connects the component to the conductor layer, and
    patterning the conductor layer to form the conductor-pattern layer.

2. Method according to claim 1, wherein the contact openings are made in the unpatterned conductor layer.

3. Method according to claim 2, wherein when making the contact openings there is a support layer on a second surface of the conductor layer.

4. Method according to claim 3, wherein the contact openings are made from the direction of a first surface through the conductor layer, in such a way that the contact openings extend to the support layer, and before the components are connected to the conductor layer the contact openings are revealed by removing or thinning the support layer.

5. Method according to claim 1, wherein the adhesive layer comprises an insulating adhesive.

6. Method according to claim 5, wherein after the securing of the component, and before the forming of the conductor material at the contact areas of the component:
    the contact openings and the contact areas of the component are cleaned through the contact openings.

7. Method according to claim 1, wherein the conductor material connecting the component to the conductor layer is made using a chemical and/or an electrochemical metallization method.

8. Method according to claim 1, wherein the conductor layer is included in a board, which has a first and a second surface, and which board includes an insulating-material layer between the first and the second surfaces, as well as the conductor layer on at least the first surface, and that in the method:
    at least one recess for the component is made in the board and extends through the second surface and the insulating-material layer to the conductor layer on the first surface, which covers the recess from the direction of the first surface,
in which case the contact openings are made in the conductor layer at the bottom of the recess.

9. Method according to claim 8, in which the component is one of a plurality of components which are placed in the insulating-material layer facing towards both the first and the second surface and electrical contacts are formed to the components in such a way that at least some of the components are connected to the conductor layer on the first surface and at least another of the components is connected to the conductor layer on the second surface.

10. Method according to claim 1, wherein a first surface of the conductor layer, against which the component is attached, is a bare surface and after the securing of the component:
    an insulating-material layer, which surrounds the component, is made on the first surface of the conductor layer.

11. Method according to claim 10, wherein a second conductor layer is made on the insulating-material layer such that the insulating-material layer is between the first conductor layer and the second conductor layer.

12. Method according to claim 1, wherein more than one component is embedded in the electronic module and the embedded components are connected electrically to each other in order to create an operational totality.

13. Method according to claim 1, in which the component is an unpackaged microcircuit chip.

14. Method according to claim 1, wherein when making the contact openings there is a support layer on a second surface of the conductor layer.

15. Method according to claim 5, wherein the conductor material connecting the component to the conductor layer is made using a chemical and/or an electrochemical metallization method.

16. Method according to claim 5, wherein the conductor layer is included in a board, which has a first and a second surface, and which board includes an insulating-material layer between the first and the second surfaces, as well as the conductor layer on at least the first surface, and that in the method:

at least one recess for the component is made in the board and extends through the second surface and the insulating-material layer to the conductor layer on the first surface, which covers the recess from the direction of the first surface, in which case the contact openings are made in the conductor layer at the bottom of the recess.

17. Method according to claim 5, wherein a first surface of the conductor layer, against which the component is attached, is a bare surface and after the securing of the component:

an insulating-material layer, which surrounds the component, is made on the first surface of the conductor layer.

18. Method according to claim 3, wherein the adhesive layer comprises an insulating adhesive.

19. Method according to claim 3, wherein a first surface of the conductor layer, against which the component is attached, is a bare surface and after the securing of the component:

an insulating-material layer, which surrounds the component, is made on the first surface of the conductor layer.

20. Method according to claim 3, wherein more than one component is embedded in the electronic module and the embedded components are connected electrically to each other in order to create an operational totality.

\* \* \* \* \*